United States Patent
Lu et al.

(10) Patent No.: US 8,518,741 B1
(45) Date of Patent: Aug. 27, 2013

(54) WAFER-TO-WAFER PROCESS FOR MANUFACTURING A STACKED STRUCTURE

(71) Applicant: International Business Machines Corporation, Armonk, NY (US)

(72) Inventors: Minhua Lu, Yorktown Heights, NY (US); Eric Daniel Perfecto, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/671,098

(22) Filed: Nov. 7, 2012

(51) Int. Cl.
H01L 21/44 (2006.01)

(52) U.S. Cl.
USPC .......... 438/106; 438/107; 438/109; 438/113; 438/114; 438/118; 438/126; 438/127

(58) Field of Classification Search
USPC ................ 438/106, 107, 109, 113, 114, 118, 438/126, 127
See application file for complete search history.

(56) References Cited

U.S. PATENT DOCUMENTS

| 7,157,787 B2 | 1/2007 | Kim et al. | |
| 8,101,996 B2 | 1/2012 | Wang | |
| 2009/0032928 A1* | 2/2009 | Chiang et al. | 257/686 |
| 2009/0294916 A1 | 12/2009 | Ma et al. | |
| 2010/0134126 A1* | 6/2010 | Hong et al. | 324/757 |
| 2011/0086580 A1 | 4/2011 | Chen | |
| 2013/0026643 A1* | 1/2013 | England et al. | 257/774 |

FOREIGN PATENT DOCUMENTS

| CN | 102347209 A | 2/2012 |
| FR | 2905198 A1 | 2/2008 |

OTHER PUBLICATIONS

Mottaqiallah Taouil et al, "On maximizing the compound yield for 3D Wafer-to-Wafer stacked ICs", 2010.
English Abstract for Publication No. CN 102347209 A.
English Abstract for Publication No. FR 2905198 A1.

* cited by examiner

*Primary Examiner* — Thanh V Pham
(74) *Attorney, Agent, or Firm* — Louis J. Percello, Esq.

(57) ABSTRACT

A method for fabricating a multi-chip stacked structure includes joining multiple wafers with interconnect structures interposed between each set of adjacent wafers. As each wafer is added to the stack, the new wafer is thinned to expose a through silicon via and back side metallization is performed. After the last wafer has been so joined, the wafer stack is diced and then joined to a substrate with a final interconnect structure interposed between the final wafer and the substrate.

25 Claims, 6 Drawing Sheets

WAFER-TO-WAFER PROCESS FOR MANUFACTURING A STACKED STRUCTURE

TECHNICAL FIELD

The present disclosure generally relates to manufacturing a stacked structure, and more particularly, to wafer-to-wafer process for manufacturing a stacked structure.

DISCUSSION OF RELATED ART

In the field of wafer packaging, a three-dimensional (3D) packaging having a through-silicon via (TSV) may be created. The process of manufacturing the 3D packaging involves a glass handler to support thin silicon wafers during processing steps and to bond the thinned silicon chips onto another chip or substrate. The fragility of the wafers and the potential for warpage of the wafers makes positioning and bonding a challenging task. In addition the high thermal resistance of the glass makes high power testing effectively impossible.

BRIEF SUMMARY

A method for fabricating a multi-chip stacked structure includes joining multiple wafers with interconnect structures interposed between each set of adjacent wafers. As each wafer is added to the stack, the new wafer is thinned to expose a through silicon via and back side metallization is performed. After the last wafer has been so joined, the wafer stack is diced and then joined to a substrate with a final interconnect structure interposed between the final wafer and the substrate.

A method for fabricating a multi-chip stacked structure includes joining a first wafer and a second wafer with a first interconnect structure interposed therebetween to form a wafer stack. A gap between the first wafer and the second wafer is filled. The second wafer is thinned to expose a first through silicon via. A back side metallization process is performed on a surface of the second wafer having the exposed first through silicon via. The surface of the second wafer having the exposed first through silicon via of the wafer stack is joined to a third wafer with a second interconnect structure interposed therebetween, the third wafer having a second through silicon via. The third wafer is thinned to expose the second through silicon via. A back side metallization process is performed on a surface of the third wafer having the exposed second through silicon via. The wafer stack including the third wafer is diced. The wafer stack is joined to a substrate with a third interconnect structure interposed therebetween.

The third wafer may be a full thickness wafer. The joining of the first wafer and the second wafer to form the wafer stack may include a reflow process. The joining of the first wafer and the second wafer to form the wafer stack may include a thermal compression process or a vacuum bonding process.

The first wafer may be thinned prior to joining the wafer stack to the third wafer. An underfill material may be deposited between the wafer stack including the third wafer and the substrate. The underfill may be pre-applied on one of the wafers of the wafer stack prior to wafer bonding. An underfill material may be deposited on the wafer stack prior to joining the wafer stack to the substrate.

The first interconnect may be tested prior to joining the wafer stack to the third wafer and the second interconnect may be tested prior to joining the wafer stack to the substrate.

A method for fabricating a multi-chip stacked structure includes joining a first wafer and a second wafer with a first interconnect structure interposed therebetween to form a wafer stack. A gap between the first wafer and the second wafer is filled with underfill material. The underfill material is fully cured prior to the subsequent process steps. The second wafer is thinned to expose a first through silicon via. A back side metallization process is performed on a surface of the second wafer having the exposed first through silicon via. The wafer stack is joined to an additional wafer with an additional interconnect structure interposed therebetween, the additional wafer having an additional through silicon via. A gap between the additional layer and the wafer stack is filled. The additional wafer is thinned to expose the additional through silicon via. A back side metallization process is performed on a surface of the additional wafer having the exposed additional through silicon via. The steps of joining the wafer stack to an additional wafer having an additional through silicon via, filling the gap, thinning the additional wafer, and performing back side metallization are repeated until a desired number of additional wafers have been joined to the wafer stack. The surface of a final additional wafer is joined to a final wafer with a final interconnect structure interposed therebetween, the final wafer having a final through silicon via. The final wafer is thinned to expose the final through silicon via. A back side metallization process is performed on a surface of the final wafer having the exposed final through silicon via. The wafer stack including the final wafer is diced. The wafer stack is joined to a substrate with a substrate interconnect structure interposed therebetween.

The final wafer may be a full thickness wafer. The joining of the first wafer and the second wafer and the joining of the additional wafer stacks to the second wafer and to each other may include a reflow process. The joining of the first wafer and the second wafer and the joining of the additional wafer stacks to the second wafer and to each other may include a thermal compression process or a vacuum bonding process. The first wafer may be thinned prior to joining the wafer stack to the third wafer. An underfill may be deposited between the wafer stack including the final wafer and the substrate. Each interconnect of the first interconnect, the second interconnect, and the additional interconnects may be tested during the performance of the method.

Tested repair wiring routes may be incorporated in to the third wafer prior to depositing joining metallurgy in joining the wafer stack to the substrate.

A method for fabricating a multi-chip stacked structure includes joining a first wafer and a second wafer with a first interconnect structure interposed therebetween to form a wafer stack. A gap between the first wafer and the second wafer is filled with an underfill. The second wafer is thinned to expose a first through silicon via. A back side metallization process is performed on the wafer stack. The wafer stack is joined to a third wafer with a second interconnect structure interposed therebetween. The third wafer is thinned to expose a second through silicon via. A back side metallization process is performed on the wafer stack. The wafer stack is diced. The diced wafer stack is joined to a substrate with a third interconnect structure interposed therebetween.

Prior to joining the third wafer to the wafer stack, at least one intermediate stack may be joined to the wafer stack. Each of the at least one intermediate stacks may have an intermediate interconnect interposed between the intermediate stack and the wafer stack. Thinning may be performed on the intermediate stack to expose a corresponding through silicon via. Back side metallization may be performed on the intermediate stack.

The third wafer may be a full thickness wafer. The joining of the first wafer and the second wafer to form the wafer stack may include a reflow process. The joining of the first wafer and the second wafer to form the wafer stack may include a thermal compression process or a vacuum bonding process. A gap between the second wafer and the third wafer may be filled with an underfill. The underfill may be pre-applied on the second or third wafer prior to wafer bonding. An optical coupling or a winding channel or pourisity for cooling may be formed within an interconnect or underfill layer. Joining or bonding of the wafers may be performed under vacuum or thermal compression. One or more spacer posts may be formed on one or more of the wafers for gap control.

BRIEF DESCRIPTION OF THE SEVERAL VIEWS OF THE DRAWINGS

Exemplary embodiments of the present disclosure will be described below in more detail, with reference to the accompanying drawings.

DETAILED DESCRIPTION

According to exemplary embodiments of the present disclosure, a wafer-to-wafer method for manufacturing a stacked structure (e.g., 3D packaging or multiple chip stacking packaging) may eliminate the need for a backing substrate, such as glass or Si, and handling of the thinned silicon wafer during processing. In a wafer-to-wafer processing method, components of the stacked structure may be bonded with the support of a wafer to substantially ensure mechanical integrity and ease the handling. For example, a full-thickness functional wafer may be joined to a functional wafer of the stack, where the full-thickness functional wafer acts as the handler thereby eliminating the need for the backing substrate.

In forming the wafer stack, underfill may be inserted between the functional wafers to provide added structural integrity. Alternatively, the underfill may be applied to one of the wafers prior to the joining and/or bonding of the two wafer surfaces.

Exemplary embodiments of the present invention may utilize a repair scheme in which the bonded wafers are tested at each stage of bonding within the wafer stack so that any needed repair wiring may be incorporated into the wafer stack prior to applying the next wafer layer.

Further, during a bonding process step of the wafer-to-wafer method, mechanical procedures, such as using a vacuum apparatus for holding the wafer flat and applying pressure to the wafer stack, may be used to reduce the wafer warp-age of a bonded wafer structure. Exemplary embodiments of the present invention may utilize an integration scheme where the wafer stack is tested and repair wiring included in the next bonded wafer is included.

A built up stacking structure may be mechanically stronger than a single wafer or interposer, and may reduce a risk due to coefficient of thermal expansion (CTE) mismatching between a silicon wafer and a substrate. According to an exemplary embodiment of the present disclosure, because a glass backing structure is not present, the stacked structure can be tested at every step. Furthermore, defects may be corrected with rewiring in a later manufactured layer of the stacked structure. Through the use of a silicon substrate, high power testing may be employed.

According to an exemplary embodiment of the present disclosure, interposers can take more than one type of wafer and may be used to build a multi-chip module (MCM) in a single step.

Figure 1:
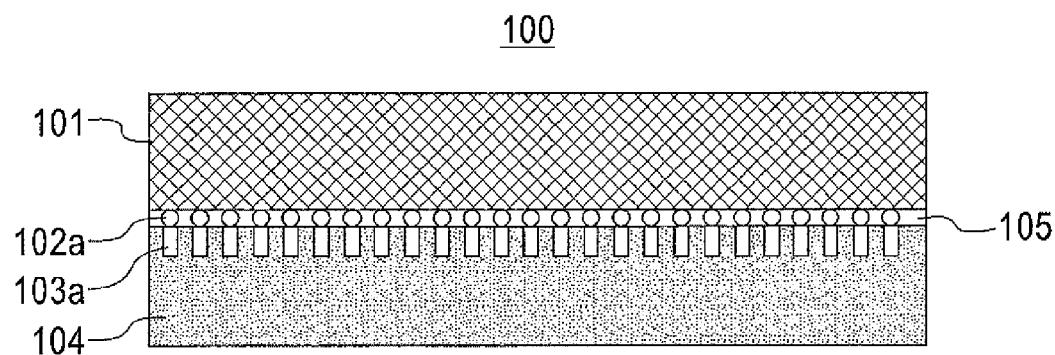
FIGS. 1-3 illustrate a method for manufacturing a stacked structure according to exemplary embodiments of the present disclosure.
Figure 2:
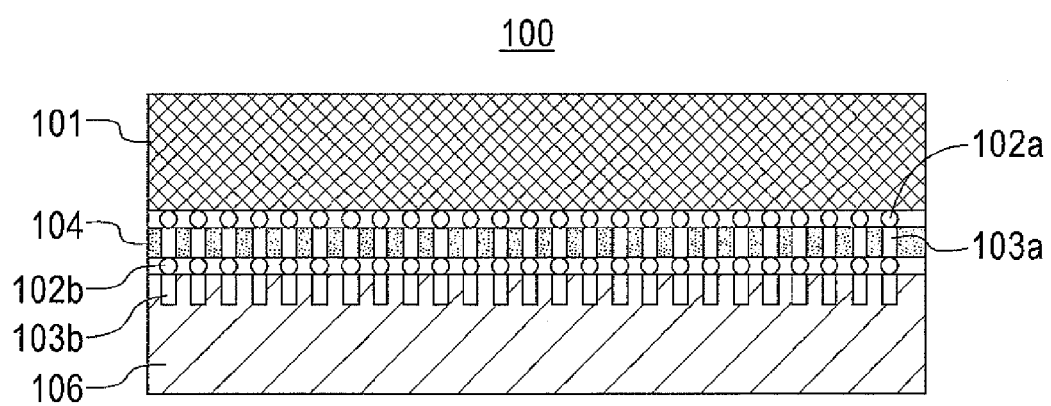
Figure 3:
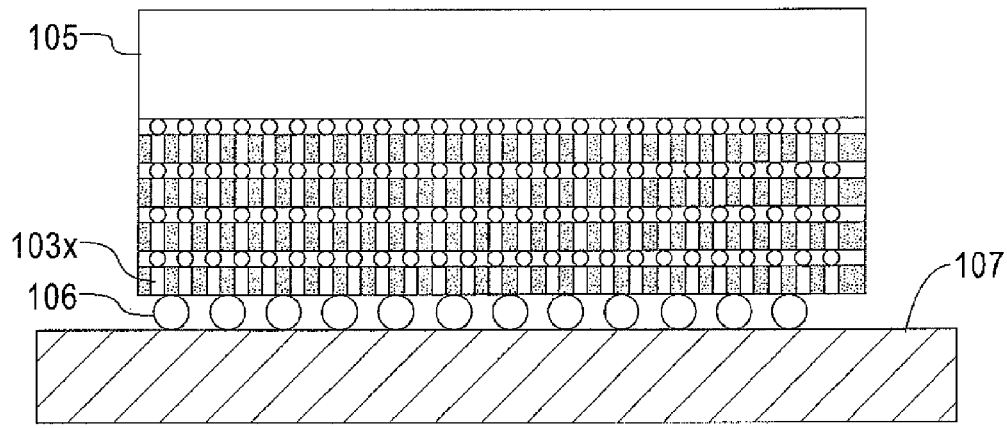
Figure 4:
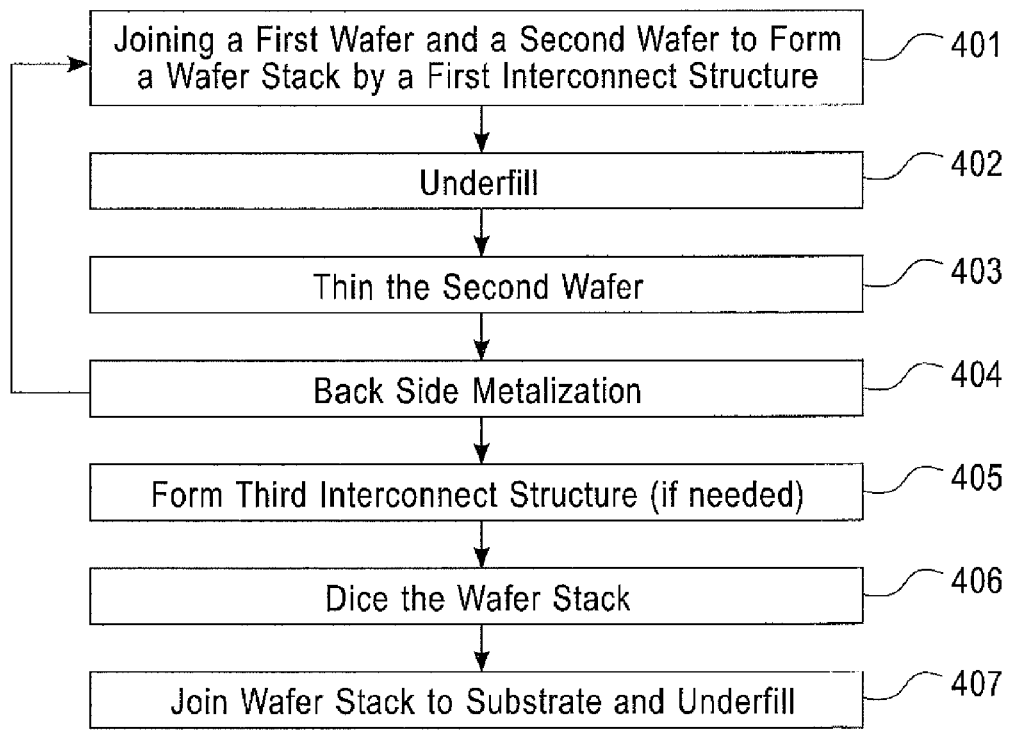
FIG. 4 is a flow diagram illustrating a method for manufacturing a stacked structure according to exemplary embodiments of the present disclosure.
Figure 5:
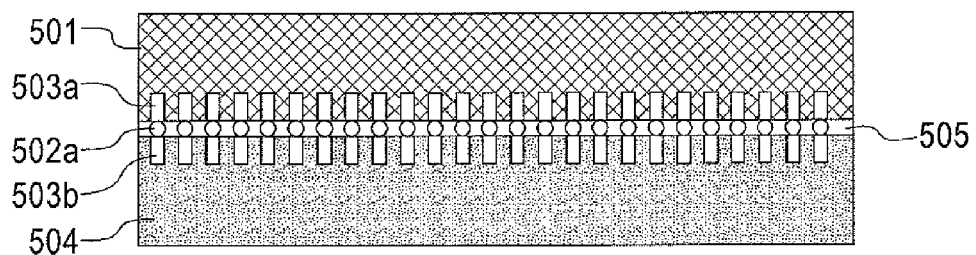
FIGS. 5-7 illustrate methods for manufacturing a stacked structure according to exemplary embodiments of the present disclosure.

Referring now to FIGS. 1-4, a wafer level method for fabricating multi-chip stacked structure includes joining a first wafer 101 and a second wafer 104 to form a wafer stack 100 (see FIG. 4, block 401). The first wafer 101 and the second wafer 104 may be joined by a first interconnect structure (e.g., 102a). A gap between the first wafer and the second wafer may be filed using an underfill or filler 105 (see block 402). The underfill or filler may be applied after wafer bonding, or it may be pre-applied on one of the wafers before bonding.

Figure 11:
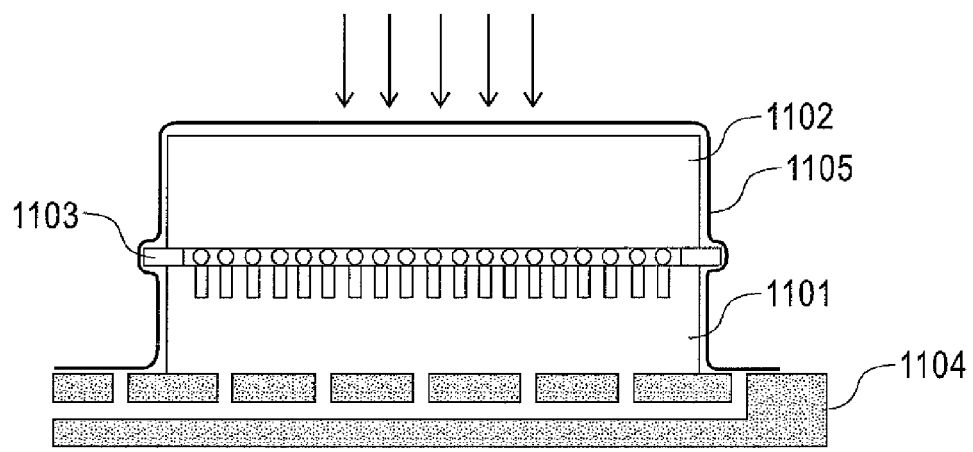
FIG. 11 illustrates a method of wafer joining using a vacuum apparatus in accordance with exemplary embodiments of the present disclosure.

The joining or bonding of the wafers may be performed in a vacuum or the like to flatten the wafers. FIG. 11 illustrates a method for performing vacuum assisted bonding in accordance with exemplary embodiments of the present disclosure. The pre-aligned wafer stack comprising the first wafer 1102 (or stacked wafers), the second wafer (1101), and spacers 1103 for controlling the wafer to wafer gap, is placed on a vacuum chunk 1104 having a flat surface. Vacuum pressure is applied through the vacuum chuck 1104 and accordingly, the second wafer 1101 is pulled downwards and flattened. A deformable membrane 105 capable of withstanding bonding temperature is placed over the wafer stack. The deformable membrane 105 may cover those vacuum holes of the vacuum chuck 1104 that are not covered by the wafer. When vacuum pressure is turned on, the vacuum chuck 104 will pull down the wafer that is in contact with the chuck (the second wafer 1101) and the air pressure on top of the membrane 105 will press down the top wafer (the first wafer 1102). The set of spacers 1103 may be inserted at the peripheral of the wafer pair to maintain a proper gap between the wafers 1101 and 1102. To provide increased planarity and gap control, spacers may be distributed on one of the wafers, by either photolithographical methods or spray or spin coating. The bonding may be achieved through the first interconnect structure, which may include solder, soft metal, metal, etc. Assembly under vacuum may be heated to form the joining.

Joining or bonding of the wafers may be performed by thermal compression or flip chip bonder.

Figure 12:
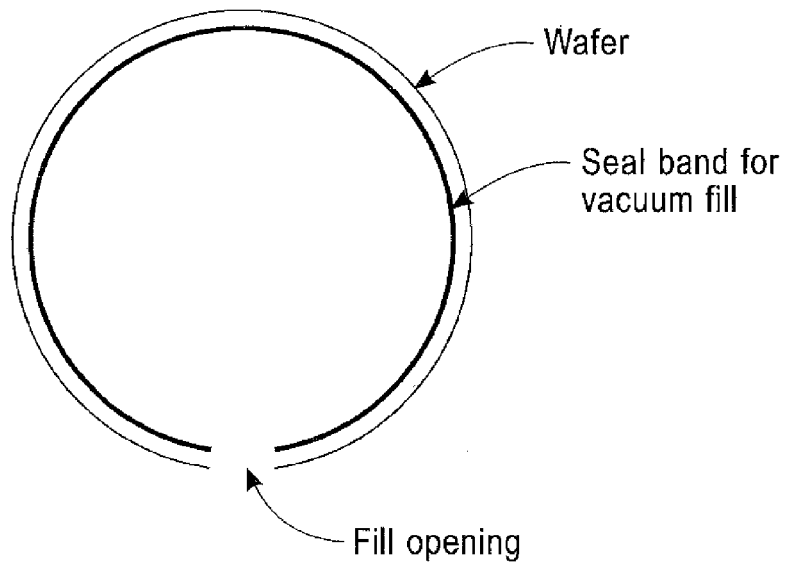
FIG. 12 is a schematic diagram illustrating a technique for filling underfill material using a vacuum apparatus in accordance with exemplary embodiments of the present disclosure.

The gap between joined wafer pair may be filled by underfill material to enhance the mechanical strength of the wafer pair, so that the wafer pair can be treated as one wafer for subsequent processes, such as wafer thinning and backside metallization. The underfill can be performed by capillary underfill or vacuum underfill after wafer bonding, or underfill can be applied to one of the wafer prior the bonding and form wafer bonding and underfill simultaneously. If vacuum underfill method is used after wafer bonding, the peripheral of the wafer pair may be sealed with a thin band of adhesive or underfill material except for a small opening. The wafer pair can be first evacuated by vacuum, followed by dipping the opening into the underfill material, and venting vacuum with air or inert gas to use external pressure to push the underfill material into the gap. Elevated temperature may be used to accelerate the filling process. This arrangement may be illustrated in FIG. 12, which is a schematic diagram illustrating a technique for filling underfill material using a vacuum apparatus in accordance with exemplary embodiments of the present disclosure. The underfill material may be cured prior the subsequent process.

Referring to FIG. 2, the second wafer 104 may be thinned to expose a first through silicon via (e.g., 103a) (see block 403). A back side metallization process may be performed on a surface of the second wafer having an exposed first through silicon via (TSV) (see block 404). Thereafter, the process of joining additional wafers (401), providing underfill (402), thinning the additional wafer (403), and performing back side metallization (404) may be repeated for as many additional wafers as is desired.

The wafer stack 100, that may be treated as a single wafer, may be joined to a third wafer 106 having a second through silicon via (TSV) (e.g., 103b) to the surface of the second wafer 104 having an exposed first through silicon via (e.g., 103a) by a second interconnect structure (e.g., 102b).

As exemplary embodiments of the present invention are not limited to the bonding of only three wafers, the process including joining wafers, deposited a filler, wafer thinning, and a back side metallization, may be repeated to formed additional layers, where desired.

A third interconnect structure (e.g., 106) may be formed, if needed (see block 405).

Referring to FIG. 3, the wafer stack including the third wafer, after thinning and metallization of the last wafer, may be diced (e.g., 103x) (see block 406).

The wafer stack may then be joined to a substrate 107 and underfill may be performed (see block 407)

The underfill material adds strength, preserves the flatness of the wafer stack 100 and seals in the gap. The underfill material may be an electrically-insulating adhesive such as an over-bump applied resin (OBAR) or pre applied underfill which may be applied on one of the wafers prior to the wafer joining. The underfill material may be thermally conductive as to facilitate the heat flow through the staked layers.

A patternable material that can withstand bonding condition may be applied on one of the wafers and may serve as spacer for the bonding.

The grind (back) side metallization process may include a bumping process to form the second interconnect structure. The bumping process may be performed on the wafer to be joined to the wafer stack.

The bonding can be front side to front side or front side to back side. Further, the bonding may be symmetric to compensate for stress. For example, a wafer with tensile stress on the bonding surface may be joined to a wafer with compression stress on the bonding surface to minimize the curvature difference between the joining surfaces. The curvature of the wafer can be adjusted by depositing thin film stacks on the back surface of the wafer. Alternatively, the bonding tool can preferentially cool one of the bonded surfaced faster than the other to balance the wafer bow.

Since the wafer bonding is performed on two full thickness wafers, the wafers may be strong enough to withstand the wafer handling and mechanical pressure during the bonding process.

For a structure having a large number of layers, sub-stacks may be formed, for example, including two to four layer stacks. One of the wafers may be a full-thickness wafer wile the remaining wafers may be thinned. These sub-stacks may be joined face-to-face, followed by wafer thinning and back-side metallization, to form a final packaging.

Referring now to FIGS. 5-8, a wafer level method for fabricating multi-chip stacked structure includes joining a first wafer 501 and a second wafer 504 to form a wafer stack 500 (see block 801). The first wafer 501 and the second wafer 504 may include respective first through silicon via (TSV) (e.g., 503a) and second through silicon via (TSV) (e.g., 503b). The first wafer 501 and the second wafer 504 may be joined by a first interconnect structure (e.g., 502a). A gap between the first wafer and the second wafer may be filed using an underfill or filler 505 (see block 802). The second wafer 504 may be thinned to expose the second through silicon via (TSV) (e.g., 503b) (see block 803).

The joining or bonding of the wafers may be performed in a vacuum or thermal compression or the like to flatten the wafers. The bonding may be achieved through the first interconnect structure, which is a solder, soft metal, metal, etc. Spacer posts (not shown) may be formed on one of the wafers for gap control.

Figure 6:
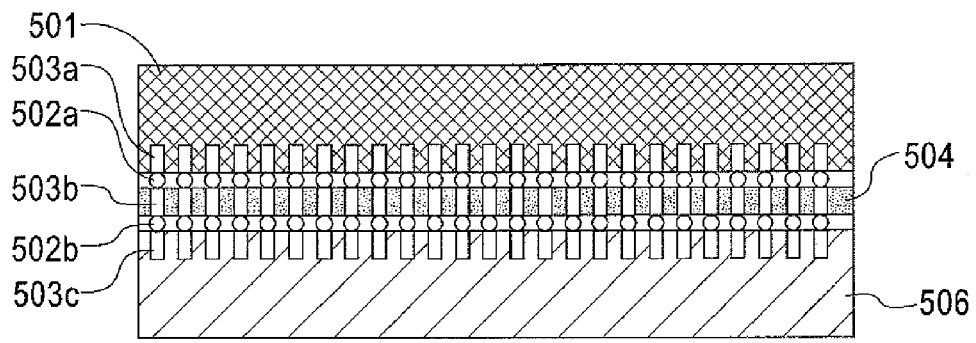
Figure 7:
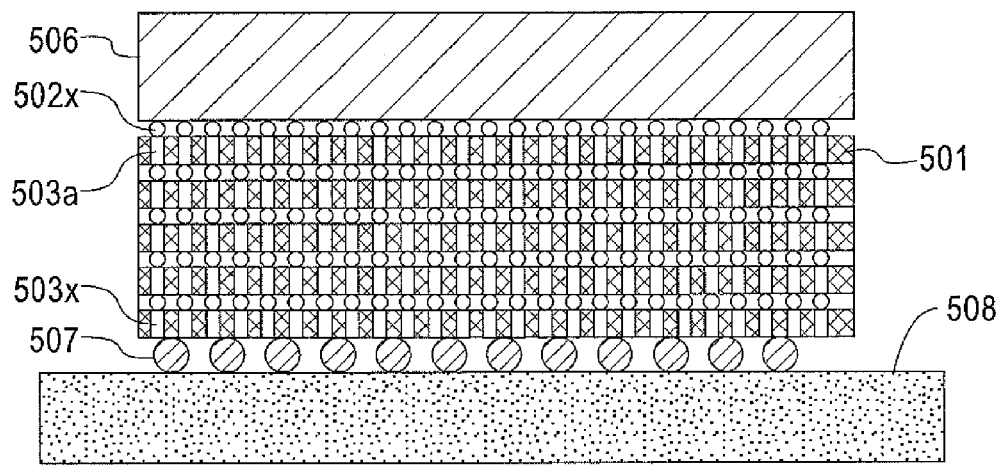

Referring to FIG. 6, a back side metallization process may be performed on a surface of the second wafer 504 having an exposed second through silicon via (TSV) (see block 804). Thereafter, the steps of joining additional wafers using an additional interconnect structure (810), performing underfill (802), thinning the additional wafer (803), and providing back side metallization may be repeated for as many additional wafers are desired.

A process including joining wafers, deposited a filler underfill, wafer thinning, and a back side metallization, may be repeated to formed additional layers. Additional layers may also be form by depositing the underfill on the solder side, including joining wafers, thinning the joined wafer, and a back side metallization. In so doing, the wafer stack 500 may be joined to a third wafer 506 having a third through silicon via (TSV) (e.g., 503c) to the surface of the second wafer 504 having an exposed second through silicon via (TSV) (e.g., 503b) by a second interconnect structure (e.g., 502b).

From this point, two possible courses of action are possible (805). According to the first course of action, a fourth wafer may be joined and underfill provided (806). Thereafter the first wafer may be thinned and back side metallization performed (807).

According to the second course of action, the stack may be joined to a glass handler (808). Then, referring to FIG. 7, the first wafer 501 may be thinned to expose the first through via (e.g., 503a) and a back side metallization process may be performed on an exposed surface of the first wafer 501 (see block 809). The first wafer 501 may be joined to a fourth wafer 506 (see block 810) by a third interconnect structure 502x. The glass handler may then be released (811). An underfill material (not shown) may be disposed between the first wafer 501 and the fourth wafer 506 prior or after the bonding.

Then, regardless of the course of action taken, the wafer stack including the third wafer and the fourth wafer may be thinned to expose a lower through silicon via (TSV) (e.g., 503x) and back side metallization and forming of fourth interconnect structure may optionally be performed on the exposed lower though silicon via (e.g., 503x) (see block 812). The wafer stack may be diced. Dicing may be performed and the wafer stack may be joined to a substrate 508 by a fourth interconnect structure (e.g., 507) and underfill may be performed (see block 813).

Figure 8:
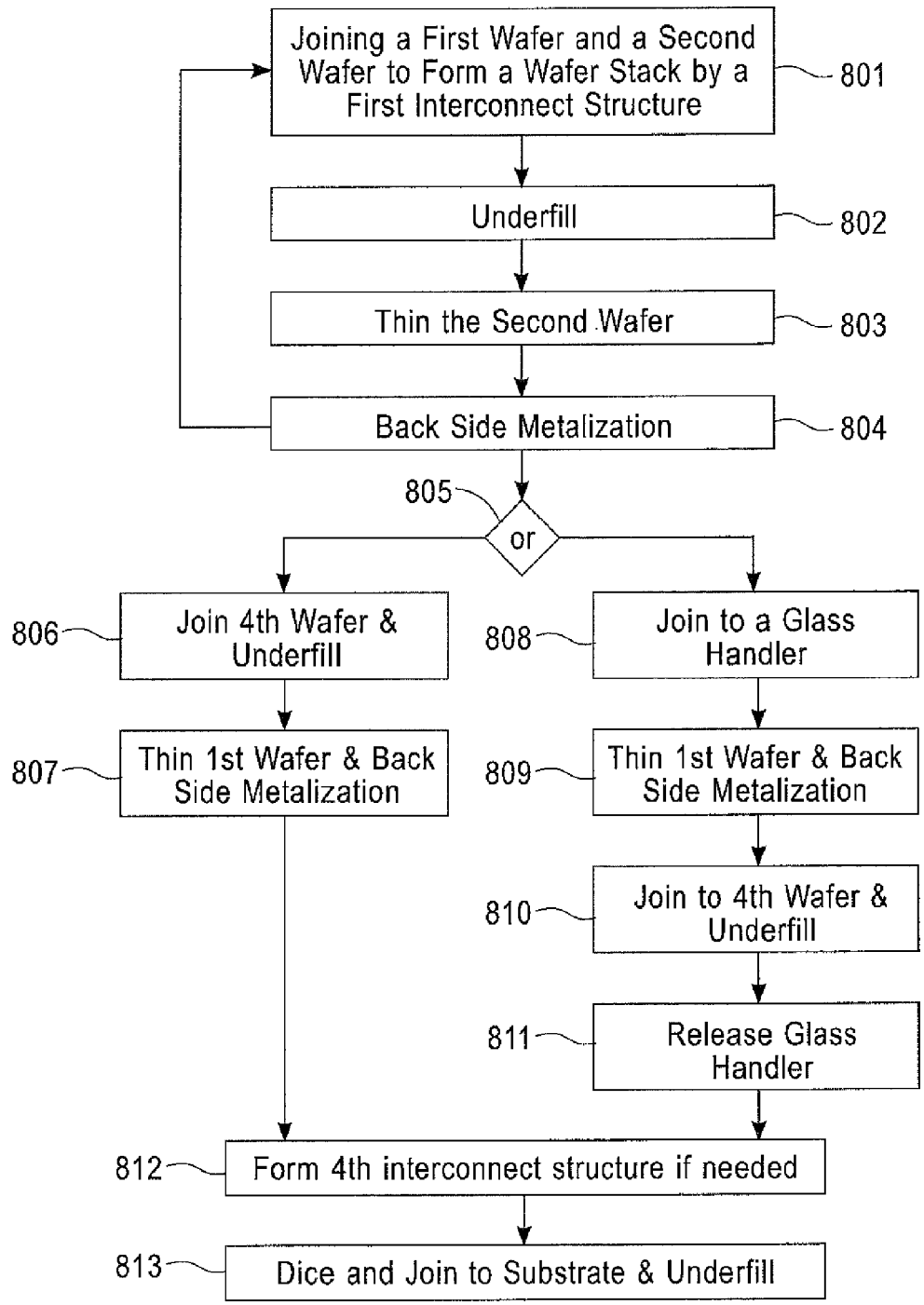
FIG. 8 is a flow diagram illustrating a method for manufacturing a stacked structure according to exemplary embodiments of the present disclosure.

The method of FIG. 8 may be modified, wherein a back side metallization process may be performed on the wafer stack of block 805. Here the stack may be laminated to a glass or thick wafer handler. The handler may be removed at a later time, e.g., prior to block 809, 810, or 811.

The thickness of the final wafer stack may be further reduced by thinning the outer wafer that theretofore had full thickness. The thinning of the outer wafer may be performed before it is diced and joined to substrate.

According to an exemplary embodiment of the present disclosure, a device formed according to FIGS. 1-8 may be tested during manufacturing (before and after bonding), wherein interconnect structures are successively exposed. Similarly, the ability to test during manufacturing enables the repair of defects in later formed layers by rewiring, for example, at block 405 of FIG. 4 or block 805 of FIG. 8.

Figure 9:
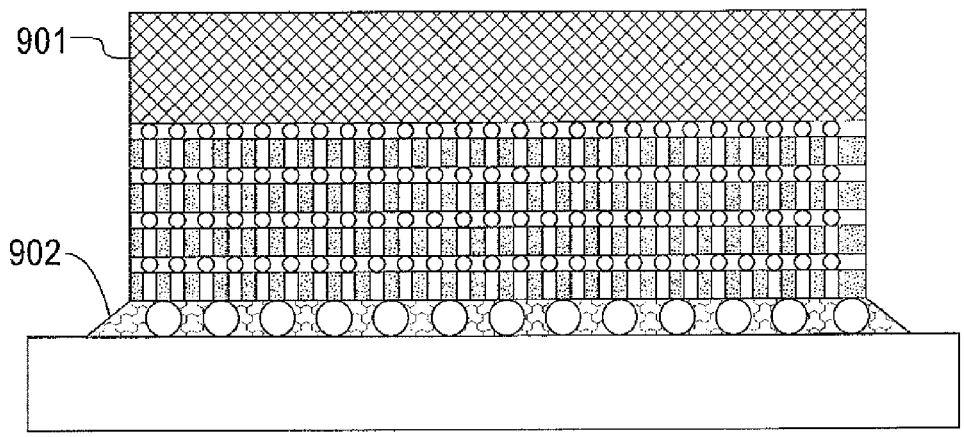
FIG. 9 illustrates a stacked structure according to exemplary embodiments of the present disclosure.

Referring to FIG. 9, a device according to an exemplary embodiment of the present disclosure is shown. The thinner stack of this arrangement has a lower thermal resistance. The devices are diced after the wafer stack is formed and the gaps are filled at the wafer level. The chip may have a clean upper edge 901. An adhesive (underfill) layer 902 may be formed between the wafer stack and the substrate.

As described above, according to exemplary embodiments of the present disclosure, joining may be performed before thinning the die. In this method, a glass handler lamination and delamination process may be eliminated.

According to an exemplary embodiment of the present disclosure, a multiple chip carrier interposer can be thin and may be, for example, between approximately 10 microns to approximately 2000 microns, for example, between 20 microns and 700 microns.

Figure 10:
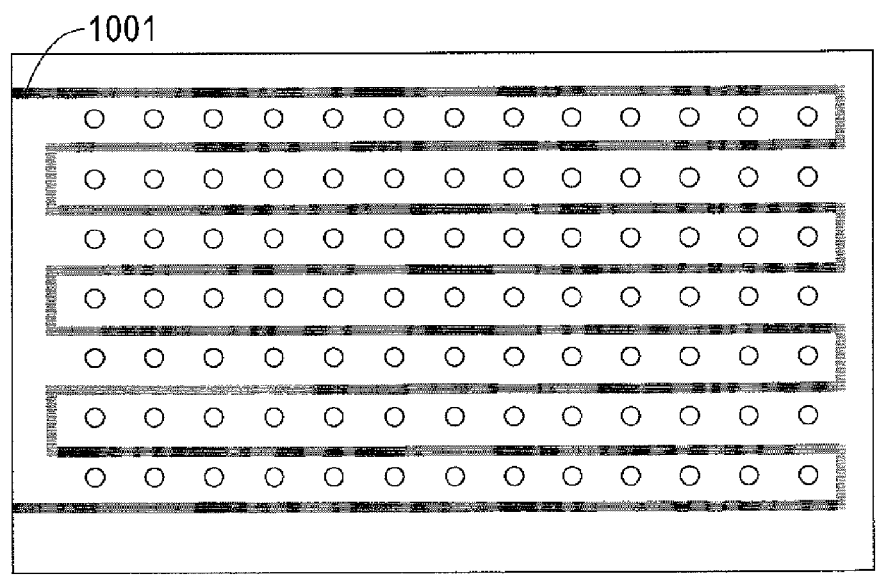
FIG. 10 shows an inter chip cooling structure in a stacked structure according to exemplary embodiments of the present disclosure.

Referring to FIG. 10, additional structures may be formed in the interconnect and underfill layers. FIG. 10 illustrate a winding channel than may be used for liquid cooling in accordance with exemplary embodiments of the present disclosure. These additional structures may include an optical coupling, inter chip cooling apparatus, or the like.

According to an exemplary embodiment of the present disclosure, a wafer and a Multi-Chip Module (MCM) interposer may be used to join multiple chips on same wafer to form a direct MCM packaging.

Although illustrative embodiments of the present disclosure have been described herein with reference to the accompanying drawings, it is to be understood that the disclosure is not limited to those precise embodiments, and that various other changes and modifications may be made therein by one skilled in the art without departing from the scope of the appended claims.

What is claimed is:

1. A method for fabricating a multi-chip stacked structure comprising:
    joining a first wafer and a second wafer with a first interconnect structure interposed therebetween to form a wafer stack;
    filling a gap between the first wafer and the second wafer;
    thinning the second wafer to expose a first through silicon via;
    performing a back side metallization process on a surface of the second wafer having the exposed first through silicon via;
    joining the surface of the second wafer having the exposed first through silicon via of the wafer stack to a third wafer with a second interconnect structure interposed therebetween, the third wafer having a second through silicon via;
    filling a gap between the second wafer and the third wafer;
    thinning the third wafer to expose the second through silicon via;
    performing a back side metallization process on a surface of the third wafer having the exposed second through silicon via;
    dicing the wafer stack including the third wafer; and
    joining the wafer stack to a substrate with a third interconnect structure interposed therebetween.

2. The method of claim 1, wherein the third wafer is of full thickness.

3. The method of claim 1, wherein the joining of the first wafer and the second wafer to form the wafer stack includes a reflow process.

4. The method of claim 1, wherein the joining of the first wafer and the second wafer to form the wafer stack includes a thermal compression process or a vacuum bonding process.

5. The method of claim 1, further comprising depositing an underfill material between the wafer stack including the third wafer and the substrate.

6. The method of claim 1, further comprising depositing an underfill material between the wafer stack including the third wafer and the substrate by vacuum fill using a peripheral seal band with an opening on wafer pair.

7. The method of claim 5, wherein the underfill is pre-applied on one of the wafers of the wafer stack prior to wafer bonding.

8. The method of claim 1, further comprising depositing an underfill material on the wafer stack prior to joining the wafer stack to the substrate.

9. The method of claim 1, further comprising thinning the first wafer prior to joining the wafer stack to the third wafer.

10. The method of claim 1, further comprising backside processing and metallization on the second wafer of the wafer stack with exposed TSV prior to joining the wafer stack to the third wafer.

11. The method of claim 1, wherein the first interconnect is tested prior to joining the wafer stack to the third wafer and the second interconnect is tested prior to joining the wafer stack to the substrate.

12. A method for fabricating a multi-chip stacked structure comprising:
    joining a first wafer and a second wafer with a first interconnect structure interposed therebetween to form a wafer stack;
    filling a gap between the first wafer and the second wafer;
    thinning the second wafer to expose a first through silicon via;
    performing a back side metallization process on a surface of the second wafer having the exposed first through silicon via;
    joining the wafer stack to an additional wafer with an additional interconnect structure interposed therebetween, the additional wafer having an additional through silicon via;
    filling a gap between the additional layer and the wafer stack;
    thinning the additional wafer to expose the additional through silicon via;
    performing a back side metallization process on a surface of the additional wafer having the exposed additional through silicon via;

repeating the steps of joining the wafer stack to an additional wafer having an additional through silicon via, filling the gap, thinning the additional wafer, and performing back side metallization until a desired number of additional wafers have been joined to the wafer stack;

joining the surface of a final additional wafer to a final wafer with a final interconnect structure interposed therebetween, the final wafer having a final through silicon via;

filling a gap between the wafer stack and the final wafer;

thinning the final wafer to expose the final through silicon via;

performing a back side metallization process on a surface of the final wafer having the exposed final through silicon via;

dicing the wafer stack including the final wafer; and joining the wafer stack to a substrate with a substrate interconnect structure interposed therebetween.

13. The method of claim 12, wherein the joining of the first wafer and the second wafer and the joining of the additional wafer stacks to the second wafer and to each other includes a reflow process.

14. The method of claim 12, wherein the joining of the first wafer and the second wafer and the joining of the additional wafer stacks to the second wafer and to each other includes a thermal compression process or a vacuum bonding process.

15. The method of claim 12, further comprising thinning the first wafer prior to joining the wafer stack to the third wafer.

16. The method of claim 12, further comprising depositing an underfill between the wafer stack including the final wafer and the substrate.

17. The method of claim 12, wherein each interconnect of the first interconnect, the second interconnect, and the additional interconnects are tested during the performance of the method.

18. A method for fabricating a multi-chip stacked structure comprising:

joining a first wafer and a second wafer with a first interconnect structure interposed therebetween to form a wafer stack;

filling a gap between the first wafer and the second wafer with an underfill;

thinning the second wafer to expose a first through silicon via;

performing a back side metallization process on the wafer stack;

joining the wafer stack to a third wafer with a second interconnect structure interposed therebetween;

filling a gap between the second wafer and the third wafer;

thinning the third wafer to expose a second through silicon via;

performing a back side metallization process on the wafer stack;

dicing the wafer stack; and joining the diced wafer stack to a substrate with a third interconnect structure interposed therebetween.

19. The method claim 18 wherein prior to joining the third wafer to the wafer stack, at least one intermediate stack is joined to the wafer stack, each of the at least one intermediate stacks having:

an intermediate interconnect interposed between the intermediate stack and the wafer stack;

thinning performed on the intermediate stack to expose a corresponding through silicon via; and back side metallization performed on the intermediate stack.

20. The method of claim 18, wherein the joining of the first wafer and the second wafer to form the wafer stack includes a thermal compression process or a vacuum bonding process.

21. The method of claim 18, further comprising filling a gap between the second wafer and the third wafer with an underfill.

22. The method of claim 21 wherein the underfill is pre-applied on the second or third wafer prior to wafer bonding.

23. The method of claim 18, wherein an optical coupling or a winding channel or porousity for cooling is formed within an interconnect or underfill layer.

24. The method of claim 18, wherein joining or bonding of the wafers is performed under vacuum or thermal compression.

25. The method of claim 18, wherein one or more spacer posts are formed on one or more of the wafers for gap control.

* * * * *